United States Patent [19]

Pfiester et al.

[11] Patent Number: 5,212,110
[45] Date of Patent: May 18, 1993

[54] METHOD FOR FORMING ISOLATION REGIONS IN A SEMICONDUCTOR DEVICE

[75] Inventors: James R. Pfiester; Howard C. Kirsch, both of Austin, Tex.

[73] Assignee: Motorola, Inc., Schaumburg, Ill.

[21] Appl. No.: 887,958

[22] Filed: May 26, 1992

[51] Int. Cl.$^5$ ............................................. H01L 21/76
[52] U.S. Cl. ......................................... 437/67; 437/72; 437/89; 437/90; 148/DIG. 50
[58] Field of Search ....................... 437/72, 73, 89, 90, 437/67; 148/DIG. 50

[56] References Cited

U.S. PATENT DOCUMENTS

| | | | |
|---|---|---|---|
| 4,666,556 | 5/1987 | Fulton et al. | 437/72 |
| 4,849,371 | 7/1989 | Hansen et al. | 437/90 |
| 4,942,137 | 7/1990 | Sivan et al. | 437/72 |

OTHER PUBLICATIONS

N. Kasai, et al. "¼ μm CMOS Isolation Technique With Sidewall Insulator and Selective Epitaxy", IEEE Int. Electron Device Meet., Washington, D.C., Dec. 1985, pp. 419-422.

Primary Examiner—Brian E. Hearn
Assistant Examiner—Trung Dang
Attorney, Agent, or Firm—Jasper W. Dockrey

[57] ABSTRACT

A process for fabricating isolation regions in a semiconductor substrate which does not depend upon pattern definition capability. In one embodiment a device isolation region (30) is formed in a semiconductor substrate (12) by first creating a trench (18) in the substrate (12). A single-crystal SiGe layer (24) is formed to overlie the wall surface (20) of the trench (18). A layer of selectively-deposited, single-crystal silicon (26) is formed in the trench (18) using both the bottom surface (22) of the trench (18) and the SiGe layer (24) as a nucleation site for the selective deposition process. After the single-crystal silicon layer (26) is formed, the SiGe layer (24) is selectively removed and the previously occupied space is filled with a dielectric material to form isolation region (30).

10 Claims, 2 Drawing Sheets

METHOD FOR FORMING ISOLATION REGIONS IN A SEMICONDUCTOR DEVICE

Field of the Invention

This invention relates in general to a method for fabricating a semiconductor device, and more particularly to a method for forming isolation regions in semiconductor device.

BACKGROUND OF THE INVENTION

As integrated circuits become more complex and include more and more devices, it becomes necessary to develop new fabrication techniques which minimize the overall size of the circuit. One area of circuit fabrication which traditionally requires large quantities of substrate area is device isolation. Typically, an oxidation resistant material is patterned on the surface of the substrate and the substrate is oxidized to form large oxide isolation regions. This process is commonly referred to as localized oxidation of silicon or LOCOS. Because it is difficult to control the oxidation process with precision, an excessive amount of unwanted lateral oxidation growth often occurs. The lateral growth of the oxide isolation region consumes portions of the substrate which could otherwise be used for active device fabrication.

To avoid the lateral growth problem associated with the LOCOS process, new techniques have been developed which form isolatin regions in vertical recesses in the substrate. The process, commonly referred to as trench isolation, includes the formation of a dielectric body in a trench structure etched into the substrate. The dielectric body is formed by either an oxidation process, or a deposition and etching process. Since the dielectric material is confined to the boundaries of the trench, lateral consumption of the substrate substantially reduced.

While the trench isolation process offers a solution to the lateral growth problem encountered with the LOCOS process, important limitations remain. The trench isolation process necessarily requires the formation of trench in the substrate. Typically, the trench is formed by defining a photolithographic pattern on the substrate followed by an etching process. The trench can only be as small as the photolithographic definition capability will allow. As a result, the dimensions of the isolation regions are limited to the photolithographic capability of the fabrication process. Further problems can be encountered during the etching process. For example, if the etch process attacks the photoresist used to form the trench pattern on the substrate surface, the trench width will be undesirably enlarged. Unwanted enlargement can also occur if the etch process undercuts the photoresist and etches away portions of the substrate underlying the edge of the photoresist pattern. Accordingly, further development of isolation process technology is required to reliably form isolation regions which minimize the amount of substrate area necessary for their formation.

BRIEF SUMMARY OF THE INVENTION

In practicing the present invention there is provided a process for forming isolation regions in a semiconductor device. In one embodiment the process includes providing a semiconductor substrate having a single-crystal silicon surface. A single-crystal SiGe layer is formed to overlie a portion of the semiconductor surface. A layer of selectively deposited silicon is formed overlying the single-crystal silicon surface and the SiGe layer. During the selective deposition, both the single-crystal silicon and the SiGe provide a nucleation site for the selective silicon deposition.

Figure 1:
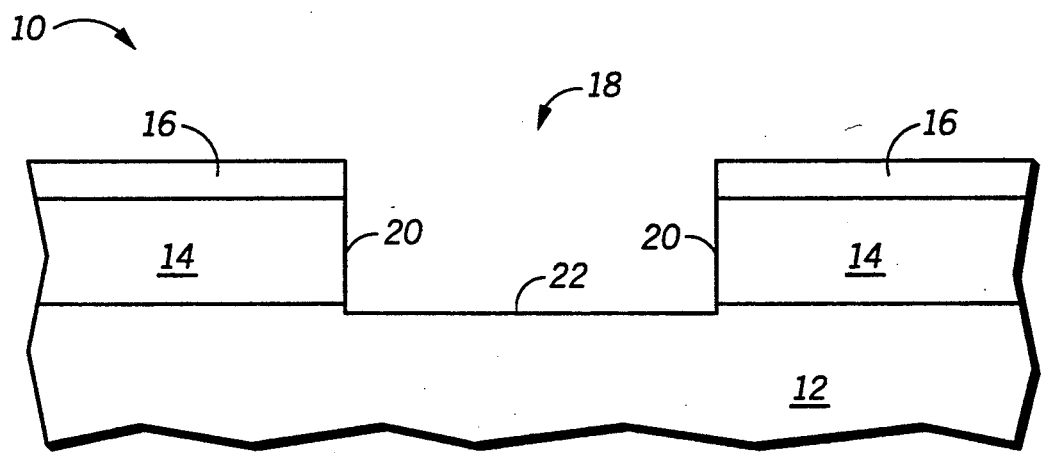
FIGS. 1-5 illustrate, in cross section, process steps in accordance with the one embodiment of the invention.

It will be appreciated that for simplicity and clarity of illustration elements shown in the FIGURES have not necessarily been drawn to scale. For example, the dimensions of some of the elements are exaggerated relative to each other for clarity. Further, where considered appropriate, reference numerals have been repeated among the FIGURES to indicate corresponding elements.

DETAILED DESCRIPTION OF THE INVENTION

One embodiment of the invention is illustrated in FIGS. 1-5 depicting the formation of an isolation structure. Although this embodiment is described in terms of the formation of an isolation structure between adjacent devices of opposite polarity, the invention is not limited to the formation of isolation structures. The invention is generally applicable to any process in which a silicon body is selectively formed on a single-crystalline silicon substrate.

Shown in FIG. 1 is a semiconductor device 10 including a semiconductor substrate 12 formed from single-crystal silicon of a first conductivity type. A well region 14 of a second conductivity type is formed in substrate 12. Well region 14 extends from the surface of substrate 12 into substrate 12 where a PN junction is formed at a distance below the surface. An insulating layer 16 overlies well region 14. Well region 14 can be formed by ion implanting a conductivity determining dopant into substrate 12 using a photolithographic pattern to define a series of well regions. Alternatively, a blanket doping method can be used to form a continuous doped layer in all surface regions of substrate 12. A trench 18 extends into substrate 12 through insulating layer 16 and well region 14. Trench 18 is preferably formed by photolithographic patterning and anisotropic etching to create a vertical wall surface 20 and a bottom surface 22.

Following the formation of trench 18, a layer of Silicon Germanium (SiGe) is conformably deposited to overlie insulating layer 16, wall surface 20 and bottom surface 22. Preferably, the SiGe layer is formed by chemical vapor deposition using a gas mixture including Si and Ge at a temperature of about 500° to 900° C. Preferably, the SiGe deposition reaction is adjusted such that the SiGe layer has a Ge content of about 20 wt. percent. Alternatively, molecular beam epitaxy can be used. In one embodiment, the SiGe layer is deposited to a thickness of about 50 to 200 nanometers.

Figure 2:
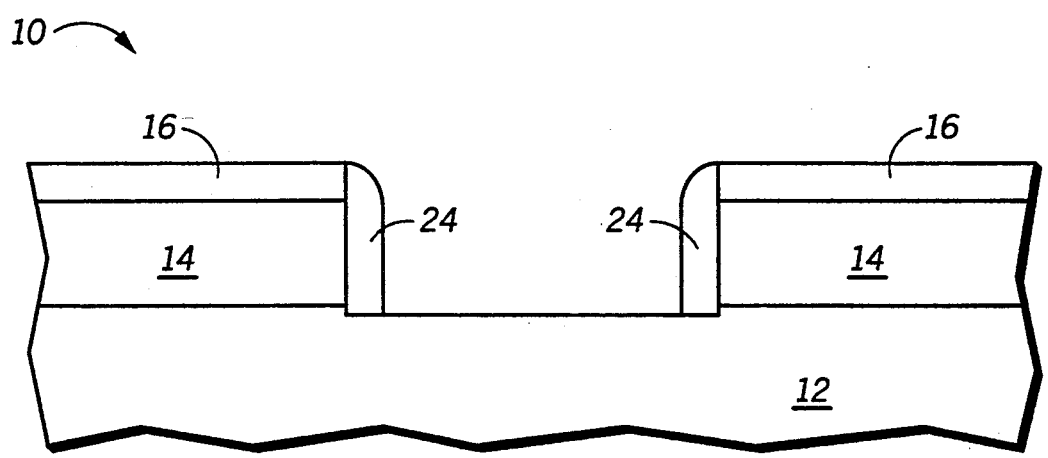

After deposition, the SiGe layer is anisotropically etched to form a SiGe sidewall layer 24 as illustrated in FIG. 2. Preferably, a reactive ion etch process is used to form sidewall layer 24. The reactive ion etch can be carried out using chlorinated or fluorinated etching gases at a system pressure of about 50 to 250 millitorr. In one method, dichloro-difluoro-methane is used to etch SiGe at a pressure of about 100 millitorr. Alternatively, a brominated etching gas such as bromo-trifluoro-methane can be used.

Preferably, the reactive ion etch should selectively etch SiGe and leave the silicon material of bottom surface 22 substantially unetched. However, the present invention also includes the use of a reactive ion etch process which etches both SiGe and silicon. In the embodiment illustrated in FIG. 2, once the SiGe layer has been removed from bottom surface 22, the removal of layers of Si from bottom surface 22 will not be detrimental to the isolation structure formed in accordance with the invention.

Figure 3:
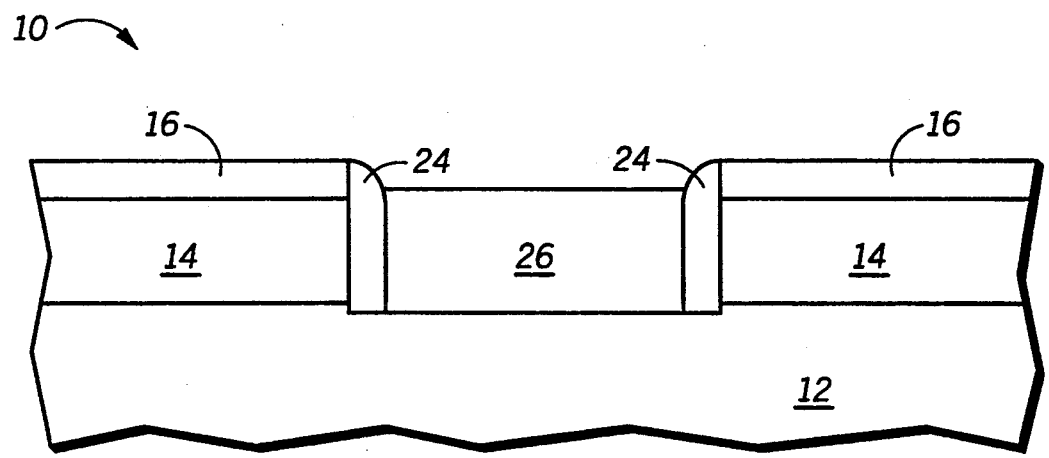

Once sidewall layer 24 is formed, a single-crystal silicon region 26 is formed in trench 18, as illustrated in FIG. 3. Preferably, a low temperature epitaxial deposition process is used to form silicon region 26. In the epitaxial deposition process, the deposition reaction is adjusted so that silicon is deposited only within trench 18. Bottom surface 22 and sidewall layer 24 act as nucleation sites for the selective deposition. Once the deposition begins on bottom surface 22 and sidewall layer 24, the deposited silicon itself acts as a nucleation site so that the reaction continues depositing successive layers of silicon eventually forming a uniformly thick layer. By carefully controlling the flow of gases, such as hydrogen chloride, which control the epitaxial reaction, the epitaxial silicon does not otherwise form an oxides or other dielectric material such as insulating layer 16. Preferably, the epitaxial deposition process is performed at a temperature of about 600° to 850° C. The selective deposition process is carried out at a temperature below the temperature at which dopant diffusion will occur. A low temperature deposition process prevents dopant diffusion in well region 14 thus preserving the uniformity of the PN junction between well region 14 and substrate 12.

During the selective deposition process, SiGe sidewall layer 24 also provides a nucleation site as successive layers of silicon are deposited in trench 18. The presence of nucleation sites on both bottom surface 22 and sidewall layer 24 improves the integrity of silicon region 26. In isolation processes of the prior art, the sidewall of an isolation trench is often covered by a dielectric material. When a selective silicon deposition is performed in a trench structure having a dielectric material on the sidewalls, the silicon is built up exclusively from the bottom of the trench. Because silicon atoms cannot nucleate on the dielectric surface, stress develops in the silicon body near the dielectric surface as successive layers of silicon are deposited. By providing a nucleation site on all surfaces of trench 18 excessive film stress is avoided.

Depending upon the requirements of the device to be constructed, silicon region 26 can be fabricated to be either a P-type material or an N-type material. A conductivity determining dopant can be introduced before, after, or during the selective deposition. For example, an ion implantation can be performed to place a conductivity determining dopant into the bottom and wall surfaces of trench 18 prior to selective deposition. Alternatively, a conductivity determining dopant can be introduced with the selective deposition gases. The selectively deposited silicon will then have the dopant incorporated as the deposition process takes place. In another alternative method, after deposition, a photolithographic pattern can be defined and silicon region 26 can be selectively implanted with dopant.

Figure 4:
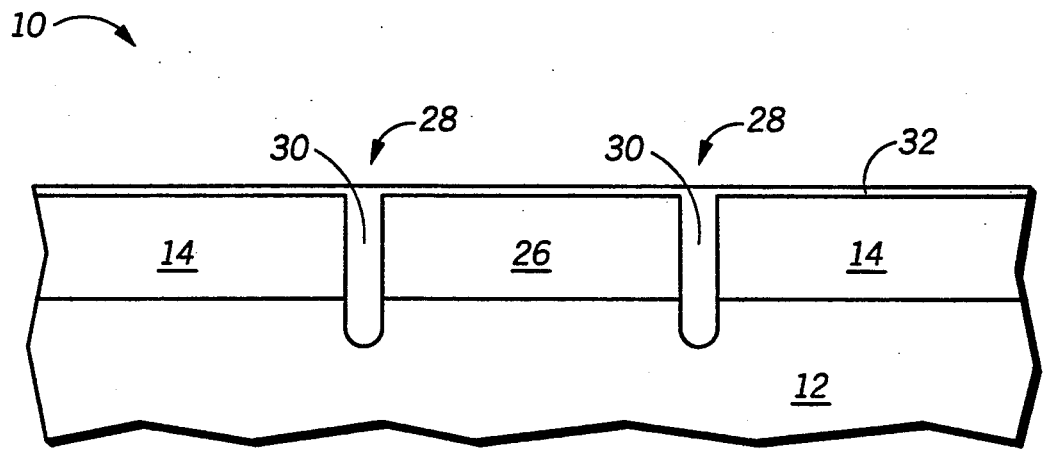

After silicon region 26 is formed, a selective etch process is used to remove sidewall layer 24. Preferably, a wet etch process is used comprising a solution of hydrogen fluoride, hydrogen peroxide, and acetic acid. In one method, a solution having corresponding mole ratios of (1:2:3) is used. The wet etch solution selectively etches SiGe while leaving silicon substantially unetched. The removal of sidewall layer 24 leaves a void 28 surrounding silicon region 26. Insulation layer 16 is also removed, preferably by a wet etch process using buffered hydrofluoric acid. Then, an oxidation process is used to form a silicon oxide layer 30 which fills void 28 and forms a gate dielectric layer 32 overlying well region 14 and silicon region 26 as shown in FIG. 4. Alternatively, oxide layer 28 can be formed by depositing a dielectric layer onto substrate 12 which fills void 28. In one method, the dielectric layer is formed by electron cyclotron resonance deposition. In an alternate method, the dielectric layer is deposited by chemical vapor deposition. After deposition, the dielectric layer is etched back to remove portions of the dielectric layer overlying the surface of well region 14 and silicon region 26.

Following the oxidation process, the structure appears as illustrated in FIG. 4. Oxide layer 30 isolates well region 14 from silicon region 26. Because the width of void 28 is substantially determined by the deposited thickness of sidewall layer 24, the thickness of oxide layer 30 can be made very small. For example, when SiGe layer is conformably deposited to a thickness of 50 to 200 nanometers, the subsequent anisotropic etch will form sidewall layer 24 to approximately the same 50 to 200 nanometer thickness. Therefore, the isolation layer width is determined by the thickness of the SiGe layer used to form sidewall layer 24.

Figure 5:
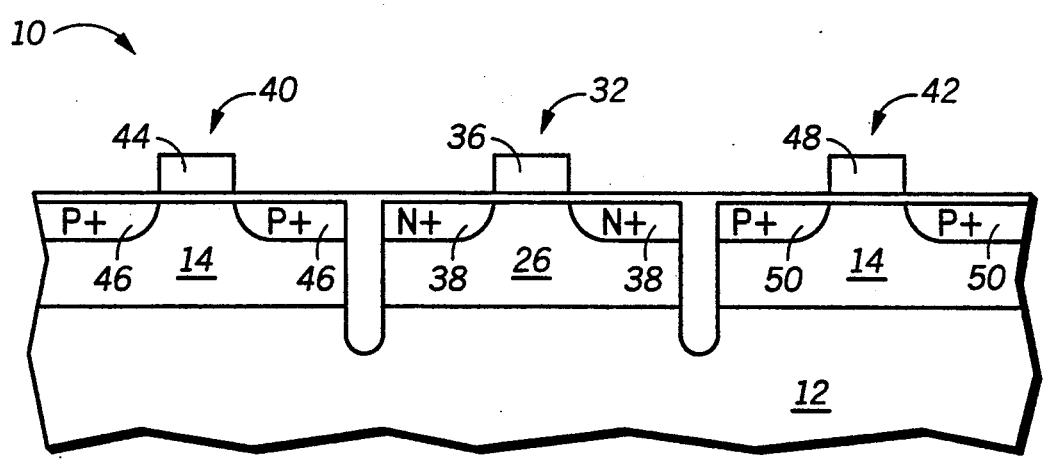

The electrically isolated regions formed in substrate 12 can be used to place MOS transistors of different conductivity types in close proximity to each other. The structure shown in FIG. 5 illustrates one embodiment in which an N-channel MOS transistor 32 is constructed in silicon region 26. MOS transistor 32 has a gate electrode 36 and N+ source and drain regions 38. P-channel MOS transistors 40 and 42 are constructed in well region 14 on either side of N-channel MOS transistor 32. MOS transistor 40 includes a gate electrode 44 and P+ source and drain regions 46. Similarly, MOS transistor 42 includes a gate electrode 48 and P+ source and drain regions 50. In the embodiment shown, silicon region 26 is doped with a P-type dopant and well region 14 is doped with an N-type dopant.

One of skill in the art will recognize that numerous other device constructions are possible using the inventive isolation process. For example, MOS transistors having a different conductivity type than that depicted in FIG. 5 are possible. Also, adjacent MOS transistors can be of the same conductivity type. Furthermore, different types of transistors can be formed in the isolated substrate regions. For example, a bipolar transistor can be formed in one or more of the isolated substrate regions.

Thus it is apparent that there has been provided, in accordance with the invention, a method for forming isolation regions in a semiconductor device which fully meets the advantages set forth above. Although the invention has been described and illustrated with reference to specific illustrative embodiments thereof, it is not intended that the invention be limited to those illustrative embodiments. Those skilled in the art will recognize that variations and modifications can be made without departing from the spirit of the invention. For example, the semiconductor substrate can be a silicon-oninsulator substrate wherein a dielectric material underlies a continuous single-crystal silicon body. It is therefore intended to include within the invention all such variations and modifications as fall within the scope of the appended claims and equivalents thereof.

We claim:

1. A method for forming a semiconductor device comprising: providing a substrate having a single-crystal silicon surface;

forming a single-crystal SiGe layer overlying a portion of the surface, wherein the SiGe layer contacts the silicon surface at a predetermined point; and selectively forming a single-crystal silicon layer overlying the single-crystal silicon surface and contacting side portions of the SiGe layer, wherein the SiGe provides a seed layer for the formation of the single-crystal silicon layer at said side portions.

2. The method of claim 1 wherein forming a single-crystal SiGe layer comprises chemical vapor deposition using a gas mixture including Si and Ge.

3. A method for forming a semiconductor device comprising:

providing a silicon substrate having a vertical wall surface;

forming a single-crystal SiGe sidewall spacer overlying the vertical wall surface;

selectively depositing a silicon layer to form a single-crystal silicon region spaced apart from the vertical wall surface by the SiGe spacer; and selectively etching away the SiGe spacer leaving the selectively deposited silicon region.

4. The method of claim 3 wherein forming a single-crystal SiGe layer comprises chemical vapor deposition using a gas mixture including Si and Ge.

5. The method of claim 3 wherein selectively etching the SiGe layer comprises wet etching using hydrogen fluoride, hydrogen peroxide and acetic acid.

6. The method of claim 3 wherein the step of forming a single-crystal SiGe sidewall spacer comprises:

depositing a layer of SiGe to overlie the silicon substrate; and anisotropically etching the SiGe layer to form a portion of the SiGe layer on the vertical wall surface.

7. A method for forming a semiconductor device comprising:

providing a single-crystalline silicon substrate of a first conductivity type;

forming an insulating layer overlying the surface of the substrate;

etching a trench into the substrate, the trench having a wall surface;

forming a SiGe sidewall layer overlying the wall surface;

selectively forming a single-crystal silicon layer in the trench;

removing the SiGe sidewall layer leaving a space between the vertical wall surface and the single-crystal silicon layer; and filling the space with a dielectric material.

8. The method of claim 7 wherein removing the SiGe sidewall layer comprises wet etching using hydrogen fluoride, hydrogen peroxide and acetic acid.

9. The method of claim 7 wherein the step of filling the space with a dielectric material comprises oxidizing the vertical surface and the single-crystal silicon layer to from an oxide layer electrically isolating the vertical surface from the single-crystal silicon layer.

10. The method of claim 7 further comprising forming MOS transistors in the single-crystal silicon layer and in the single-crystal silicon substrate.

* * * * *

UNITED STATES PATENT AND TRADEMARK OFFICE
CERTIFICATE OF CORRECTION

PATENT NO. : 5,212,110

DATED : May 18, 1993

INVENTOR(S) : Pfiester, James Ruhl, et al.

It is certified that error appears in the above-identified patent and that said Letters Patent is hereby corrected as shown below:

Claim 9, Col. 6, line 32, "from" should be --form--.

Signed and Sealed this

First Day of February, 1994

Attest:

BRUCE LEHMAN

Attesting Officer     Commissioner of Patents and Trademarks